United States Patent

Tanaka et al.

[11] Patent Number: 5,916,731
[45] Date of Patent: Jun. 29, 1999

[54] PHOTOSENSITIVE RESIN COMPOSITION

[75] Inventors: Shinji Tanaka; Katutoshi Sasashita; Shigetora Kashio, all of Okazaki, Japan

[73] Assignee: Toray Industries, Inc., Japan

[21] Appl. No.: 08/693,111

[22] PCT Filed: Dec. 27, 1995

[86] PCT No.: PCT/JP95/02743

§ 371 Date: Aug. 19, 1996

§ 102(e) Date: Aug. 19, 1996

[87] PCT Pub. No.: WO96/20431

PCT Pub. Date: Jul. 4, 1996

[30] Foreign Application Priority Data

Dec. 27, 1994 [JP] Japan .................................. 6-326052

[51] Int. Cl.$^6$ .............................. G03F 7/037; G03F 7/033
[52] U.S. Cl. ................................... 430/281.1; 430/287.1; 430/284.1; 430/906; 430/910; 430/908
[58] Field of Search ............................ 430/281.1, 287.1, 430/284.1, 906, 910, 908

[56] References Cited

U.S. PATENT DOCUMENTS

| | | | |
|---|---|---|---|
| 3,961,961 | 6/1976 | Rich | 430/281.1 |
| 4,405,705 | 9/1983 | Etoh et al. | 430/281.1 |
| 4,621,043 | 11/1986 | Gervay | 430/281.1 |
| 5,288,589 | 2/1994 | McKeever et al. | 430/281.1 |
| 5,314,789 | 5/1994 | Hawkins et al. | 430/325 |
| 5,372,913 | 12/1994 | Nanpei et al. | 430/281.1 |

FOREIGN PATENT DOCUMENTS

| | | | |
|---|---|---|---|
| 58-102230 | 6/1983 | Japan | 430/281 |
| 61-23143 | 1/1986 | Japan . | |
| 3-198058 | 8/1991 | Japan . | |
| 5-295305 | 11/1993 | Japan . | |

OTHER PUBLICATIONS

Yanagida et al, English Translation of JP–61023143 Translated by Diplomatics Servies, Inc, for U.S. Patent and Trademark Office, Washington, D.C., Oct. 1997.

*Primary Examiner*—Cynthia Hamilton
*Attorney, Agent, or Firm*—Austin R. Miller

[57] ABSTRACT

Provided are a photosensitive resin composition having an anionic group and a cationic group, which is characterized in that it has an anionic group content of 0.15 mole/kg or more and a cationic group content of 0.15 mole/kg or more and contains a cationic group-having polymer having a number average molecular weight of 1000 or more, and also a printing plate material to be produced by applying the composition onto a support.

The composition has excellent developability with water, and this gives a flexographic printing plate having excellent durability in printing in aqueous ink and having excellent image reproducibility in flexography.

12 Claims, No Drawings

PHOTOSENSITIVE RESIN COMPOSITION

TECHNICAL FIELD

The present invention relates to a photosensitive resin composition for printing plates and also to a printing plate material comprising the composition. In particular, it relates to a photosensitive resin composition for flexographic printing plates, which is waterproof and developable with water.

BACKGROUND ART

A photosensitive resin composition comprising, as a carrier resin component, an elastomer of chlorinated rubber, styrene-butadiene block copolymer, polyurethane or the like, along with an ethylenic unsaturated compound and a photo-polymerization initiator is useful in producing flexographic printing plate materials, as having good elastomeric characteristics. Many proposals for such compositions have been made, for example, in U.S. Pat. Nos. 2,948,611 and 3,024,180 and Japanese Patent Publication No. 51-43374.

Such known, solid, photosensitive resin plate materials must be developed with halogenated hydrocarbons. Therefore, the development of solid, photosensitive resin plate materials for flexography capable of being developed with water is desired, and some have heretofore been proposed.

In Japanese Patent Application Laid-Open Nos. 51-53903 and 53-10648, there has been proposed a photosensitive resin composition comprising a metal or ammonium salt of a carboxyl group-containing polymer. However, the composition is problematic in that it is liquid and that the water-proofness of the printing plate to be formed by the use of the composition is unsatisfactory. In Japanese Patent Application Laid-Open No. 61-22339, there has been proposed a photo-polymerizable composition comprising a salt of a carboxyl group-containing polymer with a vinyl compound having a secondary or tertiary nitrogen atom. However, the composition is also problematic in that the mechanical strength of the printing plate is insufficient and that it is difficult to produce a printing plate material having low hardness when the composition is used. In order to solve these problems, a photosensitive resin composition has been proposed in Japanese Patent Publication No. 5-6178 and U.S. Pat. No. 5,229,434, which comprises micro gel particles that form ammonium salt structures. The composition proposed therein is said to be developable with water and waterproof and that the mechanical strength of a printing plate to be formed by the use of the composition has been improved. However, in containing such micro gel particles, the composition is problematic when used in producing printing plates in that the particles remain as such on the developed plates or drop off from them with the result that the edges of the relieves formed on the plates after aqueous development thereof shall be rough and the image reproducibility of the printing plates for minor relieves is poor.

The subject matter of the present invention is to develop a photosensitive resin composition for printing plates, which has good image reproducibility, which is developable with water and which is resistant to aqueous ink.

DISCLOSURE OF THE INVENTION

The present invention is directed to a photosensitive resin composition containing an anionic group and a cationic group, which is characterized in the fact that the anionic group content is 0.15 mole/kg or more and the cationic group content is 0.15 mole/kg or more, and that the composition comprises a polymer having a cationic group and having a number average molecular weight of 1000 or more. More precisely, it is a photosensitive resin composition which comprises;

(A) a polymer having an anionic group,
(B) a polymer having a cationic group and having a number average molecular weight of 1000 or more,
(C) an ethylenic unsaturated monomer, and
(D) a photo-polymerization initiator, and which contains an anionic group in an amount of 0.15 mole/kg or more and a cationic group in an amount of 0.15 mole/kg or more.

The combination of a specific amount of the anionic group and a specific amount of the cationic group produces a salt structure. When the composition is developed with water, the salt structure is dissociated and dissolved. On the other hand, when exposed to light, the salt structure forms a crosslinked structure with the result that the solubility of the thus-exposed composition is greatly lowered. In addition, since the composition contains a polymer having a cationic group and having a number average molecular weight of 1000 or more, its solubility in water is increased and the crosslinked structure formed after exposure to light is toughened. Accordingly, the composition of the present invention can be developed with water to give a printing plate that is satisfactorily resistant to aqueous ink, and has high printing durability.

The anionic group referred to herein is a functional group having an anion or a group capable of producing an anion through its dissociation, and includes, for example, a carboxyl group, a sulfonic acid group, a phenolic hydroxyl group, a phosphoric acid group or their derivatives. Of these, the preferred group is carboxyl.

The cationic group is a group capable of forming a cation when a proton is added thereto, or a functional group having a cation. Above all, preferred are cationic groups except metal ions and ammonium ion. Especially preferred are amino groups. More preferred are tertiary amino groups and quaternary amino groups. Of these, the preferred ones are tertiary amino groups.

The amount of the anionic group in the photosensitive resin composition of the present invention shall be 0.15 mole/kg or more, but is preferably from 0.15 to 1.40 mole/kg. On the other hand, the amount of the cationic group in the composition shall be 0.15 mole/kg or more, but is preferably from 0.20 to 1.65 mole/kg. If the anionic group content and the cationic group content of the composition are too small, the aqueous developability of the composition tends to lower. However, if they are too large, the printing plate to be formed by the use of the composition is unfavorably swollen too much with water. It is desirable that the ratio of the number of anionic groups to cationic groups in the composition falls between 0.2 and 1.7. If the ratio is too small, the swelling with water of the printing plate to be formed by the use of the composition tends to increase. However, if it is too large, the developability with water of the printing plate tends to be lower.

The photosensitive resin composition of the present invention shall contain a polymer having a cationic group and having a number average molecular weight of 1000 or more. This is because if the composition does not contain a polymer of the type, the swelling of the composition with water tends to increase and the mechanical strength of the printing plate formed by the use of the composition tends to be lower. The molecule of the polymer having a cationic group and having a number average molecular weight of 1000 or more to be used herein may have an anionic group as bonded thereto.

The photosensitive resin composition of the invention shall generally contain a compound having a functional group that is crosslinkable or decomposable through exposure to light or a group capable of being converted into such a functional group, by which the composition is made photosensitive. Where the composition is used in forming a printing plate, it is desirable that the composition can be crosslinked through exposure to light. For this, in general, the photosensitive resin composition of the invention shall contain (C) an ethylenic unsaturated monomer and (D) a photo-polymerization initiator.

One preferred embodiment of the photosensitive resin composition of the invention, which has the above-mentioned characteristics, comprises the following:

(A) a polymer having an anionic group,
(B) a polymer having a cationic group and having a number average molecular weight of 1000 or more,
(C) an ethylenic unsaturated monomer, and
(D) a photo-polymerization initiator, The component (A), a polymer having an anionic group is preferably hydrophobic. Concretely, the polymer is preferably such that, when it is formed into a film having a thickness of 1 mm and when the film is dipped in water at room temperature for 24 hours, the degree of swelling with water of the film is 5% by weight or less.

The polymer of this type includes addition polymers, polycondensates, polyadducts and addition condensates having an anionic group at their side chains. Of these, preferred are addition polymers and polyadducts.

The polymer having an anionic group (A) is, if it is an addition polymer, obtained by polymerization of a monomer having a polymerizing, carbon-carbon unsaturated bond. It may also be a copolymer with a comonomer not having an anionic group at its side chain but having a polymerizing, carbon-carbon unsaturated bond. It is also possible to graft an anionic group onto a polymer not having an anionic group to thereby introduce the anionic group into the polymer.

The monomer having an anionic group and a polymerizing, carbon-carbon unsaturated bond includes, for example, carboxyl group-containing compounds such as acrylic acid, methacrylic acid, 2-(meth)acryloyloxyethylsuccinic acid, 2-(meth)acryloyloxyethylphthalic acid, maleic acid, fumaric acid and itaconic acid.

The comonomer not having an anionic group but having a polymerizing, carbon-carbon unsaturated bond, which is copolymerizable with anionic group-having monomers such as those mentioned above, includes, for example, (meth)acrylates and aliphatic diene monomers.

Concrete examples of (meth)acrylates include methyl (meth)acrylate, ethyl (meth)acrylate, propyl (meth)acrylate, butyl (meth)acrylate, isoamyl (meth)acrylate, cyclohexyl (meth)acrylate, 2-ethylhexyl (meth)acrylate, lauryl (meth)acrylate and stearyl (meth)acrylate.

Concrete examples of aliphatic diene monomers include butadiene, isoprene, chloroprene and pentadiene.

Other copolymerizable comonomers are also employable, including, for example, aromatic vinyl or vinylidene compounds such as styrene, vinyltoluene and α-methylstyrene, and also vinyl or vinylidene cyanides such as acrylonitrile and methacrylonitrile.

These monomer compounds can be polymerized through addition polymerization to give polymers having an anionic group. For example, a compound having a carbon-carbon unsaturated bond and an anionic group is dissolved in an organic solvent such as benzene or methyl ethyl ketone and polymerized through radical polymerization in the presence of a thermal polymerization initiator or a photo-polymerization initiator to give a polymer.

As polyadducts, preferably used are polymers having urethane bonds or, that is, polyurethanes. Such polymers can be produced from diisocyanates and anionic group-containing polyols through urethanation of the isocyanato group in the former and the hydroxyl group in the latter.

The diisocyanates may be aromatic, aliphatic, alicyclic or aromatic alicyclic diisocyanates, such as tolylene diisocyanate, diphenylmethane diisocyanate, 3,3'-dimethyldiphenylmethane-4,4'-diisocyanate, phenylene diisocyanate, 1,6-hexamethylene diisocyanate, naphthylene-1,5-diisocyanate, xylylene diisocyanate, tetramethylxylylene diisocyanate, 1,4-tetramethylene diisocyanate and isophorone diisocyanate.

The anionic group-containing polyols that shall be polymerized with such diisocyanates are generally compounds having two hydroxyl groups and one anionic group in one molecule.

Concretely, the polyols are compounds having two hydroxyl groups and the same carboxyl group in one molecule, such as dimethylol-acetic acid, dimethylol-propionic acid, dimethylol-butyric acid, dimethylol-valeric acid and dimethylol-caproic acid. In addition, also employable are sulfonic acid group-containing polyamido-diols and sulfonic acid group-containing polyester-diols, such as those described in Japanese Patent Application Laid-Open No. 3-206456, as well as carboxyl group-containing, partially acid-modified polyols such as those described in Japanese Patent Application Laid-Open No. 5-263060.

Polyols not having an anionic group can be copolymerized to give the polymers for use in the present invention. They include, for example, polyalcohols, polyester polyols, and polyether polyols.

The polyalcohols include, for example, ethylene glycol, propylene glycol, 1,4-butanediol, 1,6-hexanediol, diethylene glycol, triethylene glycol, glycerin, trimethylol-propane, and pentaerythritol. The polyether polyols include, for example, polyoxyethylene glycol, polyoxypropylene glycol, poly (oxyethylene/oxypropylene) glycol, and polyoxytetramethylene glycol. In addition to these, further mentioned are polymer polyols such as 1,4-polybutadiene, hydrogenated or non-hydrogenated 1,2-polybutadiene, butadiene-styrene copolymer and butadiene-acrylonitrile copolymer having terminal hydroxyl groups.

Apart from these, also employable are polyester polyols, which include, for example, polycaprolactone-diol, polyvalerolactone-diol, polyethylene adipate diol, and polypropylene adipate diol. Such polyester polyols employable in the present invention can be produced by ordinary esterification of a polybasic acid, such as maleic acid (anhydride), succinic acid (anhydride), adipic acid, fumaric acid, phthalic acid (anhydride), terephthalic acid, isophthalic acid, methyltetrahydrophthalic acid (anhydride, tetrahydro-phthalic acid (anhydride), sebacic acid, dodecanoic diacid, azelaic acid, glutaric acid, trimellitic acid (anhydride) or hexahydrophthalic acid (anhydride), with an aliphatic glycol such as ethylene glycol, propylene glycol, 1,2-butylene glycol, 1,3-butylene glycol, 1,4-butylene glycol, 2,3-butylene glycol, hexylene glycol, decane-diol or neopentyl glycol, or with an aliphatic polyether glycol such as diethylene glycol or dipropylene glycol, or with a polyalcohol such as glycerin, trimethylol-propane, 1,4-cyclohexane-dimethanol, neopentylglycol hydroxypivalate or 1,4-cyclohexane-diol.

In addition to these, further mentioned are polymer polyols such as 1,4-polybutadiene, hydrogenated or non-hydrogenated 1,2-polybutadiene, butadiene-styrene copolymer and butadiene-acrylonitrile copolymer having terminal hydroxyl groups.

The reaction of diisocyanates with polyols can be conducted in any ordinary manner. For example, a diisocyanate, an anionic group-containing polyol and any other polyol are dissolved in an organic solvent, if desired, and stirred under heat to give a polyadduct for use in the present invention.

The anionic group-containing addition polymer and the anionic group-containing polyadduct or, that is, hydrophobic polyurethane can be mixed for use in the present invention.

It is desirable that the amount of the anionic group-containing polyurethane in the photosensitive resin composition of the present invention is 10% by weight or more, preferably 15% by weight or more but is 70% by weight or less, preferably 60% by weight or less. It is further desirable that the amount in the anionic group-containing, hydrophobic polymer (A) is 50% by weight or more, preferably 80% by weight or more. This is because, if the amount of the anionic group-containing polyurethane in the composition of the invention is too small, the flexibility of the printing plate formed of the composition is often poor.

The anionic group equivalent in the anionic group-containing polymer (A) is preferably from 0.2 to 2.0 mole/kg, more preferably from 0.3 to 1.0 mole/kg. If the anionic group equivalent is less than 0.2 mole/kg, the developability of the composition with water tends to be lower. If it is more than 2.0 mole/kg, the degree of swelling of the composition with water will increase with the result that the resistance to aqueous ink of the printing plate to be formed by the use of the composition tends to be lower.

It is desirable that the anionic group-containing polymer has a number average molecular weight of from 1,000 to 1,000,000. If its molecular weight is too small, the plate material comprising the composition solidifies poorly. If its molecular weight is too large, the developability of the composition with water tends to be lower.

The amount of the anionic group-containing polymer (A) in the composition of the present invention is preferably from 10 to 70% by weight, more preferably from 15 to 50% by weight, relative to the total weight of the composition. If the amount is less than 10% by weight, the water-proofness of the printing plate to be formed by the use of the composition is poor. If it is more than 70% by weight, the developability of the composition with water tends to be lower.

Next, the component (B), a cationic group-containing polymer having a molecular weight of 1000 or more is described hereinunder.

The polymer includes addition polymers, polycondensates, polyadducts and addition condensates having a cationic group at their side chains. Of these, preferred are addition polymers.

The cationic group-containing, hydrophobic addition polymers for the component (B) are obtained by polymerizing a monomer having a cationic group at its side chain and having a polymerizing, carbon-carbon unsaturated bond. Also effective as the component (B) are copolymers obtained by copolymerization of the monomer with a comonomer not having a cationic group at its side chain but having a polymerizing, carbon-carbon unsaturated bond. It is also possible to graft a cationic group onto polymers to give the polymers for the component (B).

The addition polymers are polymers obtained by polymerization of an aminoalkyl (meth)acrylate monomer or an aminoalkyl(meth)acrylamide compound. The amino group in the monomer is preferably a tertiary amino group. Concretely, the monomer includes dialkylaminoalkyl (meth) acrylates such as N,N-dimethylaminoethyl (meth)acrylate and N,N-diethylaminoethyl (meth)acrylate; dialkylaminoalkyl(meth)acrylamides such as N,N-dimethylaminoethyl(meth)acrylamide and N,N-dimethylaminopropyl(meth)acrylamide; their salts with hydrochloric acid, sulfuric acid or acetic acid at their tertiary amino groups; and also quaternary ammonium salts to be obtained by reacting a tertiary amine with an alkyl halide or a sulfate.

The addition polymers may also be copolymers obtained by copolymerizing any of the above-mentioned monomers with other comonomers. Examples of comonomers include mono(meth)acrylates having an alcoholic hydroxyl group, such as 2-hydroxymethyl (meth)acrylate, 2-hydroxyethyl (meth)acrylate and 2-hydroxypropyl (meth)acrylate; alkyl (meth)acrylates such as methyl (meth)acrylate, ethyl (meth) acrylate, propyl (meth)acrylate, butyl (meth)acrylate, pentyl (meth)acrylate, hexyl (meth)acrylate, heptyl (meth)acrylate, octyl (meth)acrylate, nonyl (meth)acrylate, decyl (meth) acrylate, undecyl (meth)acrylate, dodecyl (meth)acrylate, tridecyl (meth)acrylate, tetradecyl (meth)acrylate, hexadecyl (meth)acrylate, heptadecyl (meth)acrylate, octadecyl (meth)acrylate, nonadecyl (meth)acrylate, eicosa (meth) acrylate, uneicosa (meth)acrylate, dodeicosa (meth)acrylate and their isomers; alkoxyalkylene glycol (meth)acrylates such as methoxydiethylene glycol (meth)acrylate, ethoxydiethylene glycol (meth)acrylate, isooctyloxydiethylene glycol (meth)acrylate, phenoxydiethylene glycol (meth) acrylate, phenoxytriethylene glycol (meth)acrylate, methoxytriethylene glycol (meth)acrylate, methoxypolyethylene glycol (meth)acrylate, nonylphenyloctadecylethylene glycol (meth)acrylate, methoxydipropylene glycol (meth) acrylate and their isomers; and also (meth)acrylamide and N-methylol (meth)acrylamide.

Of such monomers having no cationic group, preferred are alkyl (meth)acrylates and mono(meth)acrylates having an alcoholic hydroxyl group. The polymerization of these monomers gives cationic group-containing polymers having a number average molecular weight of 1000 or more and having an alcoholic hydroxyl group that may constitute the component (B), and these polymers are effective in improving the developability with water of the composition of the invention.

To produce addition polymers through copolymerization of a compound having a cationic group and a carbon-carbon unsaturated bond, a mono(meth)acrylate having a hydroxyl group and an alkyl (meth)acrylate, their proportions are preferably from 10 to 70% by weight, from 0 to 50% by weight, and from 20 to 90% by weight, respectively. If the proportion of the compound having a cationic group and a carbon-carbon unsaturated bond to the others is less than 10% by weight, the water-developability of the composition of the invention comprising the component (B) is unfavorably poor. If, however, it is more than 70% by weight, the water-proofness of the printing plate to be formed by the use of the composition is often poor. If the proportion of the mono(meth)acrylate having a hydroxyl group is more than 50% by weight, the water-proofness of the printing plate is often poor. If the proportion of the alkyl (meth)acrylate is less than 20% by weight, the water-proofness of the printing plate is poor; but if it is more than 90% by weight, the water-developability of the composition is often poor.

The cationic group equivalent in the cationic group-having polymer (B) having a molecular weight of 1000 or more is preferably from 0.2 to 3.5 mole/kg, more preferably from 0.5 to 3.0 mole/kg. If the cationic group equivalent is less than 0.2 mole/kg, the developability with water of the composition of the present invention is often poor. If, however, it is more than 3.5 mole/kg, the water-proofness of the printing plate to be formed by the use of the composition is often poor.

It is desirable that the amount of the cationic group-having polymer (B) having a molecular weight of 1000 or more in the composition is from 1 to 60% by weight, more preferably from 3 to 50% by weight, relative to the total weight of the composition. If the amount is less than 1% by weight, the water-developability of the composition is often poor; but if it is more than 60% by weight, the degree of swelling with water of the composition tends to increase too much.

The composition of the present invention preferably contains the component (C), an ethylenic unsaturated monomer, which may be any monomer capable of being polymerized through addition polymerization. For example, the monomer includes alkyl (meth)acrylates such as methyl (meth) acrylate, ethyl (meth)acrylate, propyl (meth)acrylate, butyl (meth)acrylate, isoamyl (meth)acrylate, 2-ethylhexyl (meth) acrylate, lauryl (meth)acrylate, and stearyl (meth)acrylate; cycloalkyl (meth)acrylates such as cyclohexyl (meth) acrylate; halogenoalkyl (meth)acrylates such as chloroethyl (meth)acrylate, and chloropropyl (meth)acrylate; alkoxy-alkyl (meth)acrylates such as methoxyethyl (meth)acrylate, ethoxyethyl (meth)acrylate, and butoxyethyl (meth)acrylate; phenoxyalkyl (meth)acrylates such as phenoxyethyl (meth) acrylate, and nonylphenoxyethyl (meth)acrylate; alkoxy-alkylene glycol (meth)acrylates such as ethoxydiethylene glycol (meth)acrylate, methoxytriethylene glycol (meth) acrylate, and methoxydipropylene glycol (meth)acrylate; alkylene glycol di(meth)acrylates such as ethylene glycol di(meth)acrylate, triethylene glycol di(meth)acrylate, polyethylene glycol di(meth)acrylate, neopentyl glycol di(meth) acrylate, and 1,6-hexanediol di(meth)acrylate; esters of unsaturated carboxylic acids such as (meth)acrylic acid, for example, trimethylolpropane tri(meth)acrylate, pentaerythritol tetra(meth)acrylate, and dipentaerythritol hexa(meth) acrylate; (meth)acrylamides such as (meth)acrylamide, diacetone (meth)acrylamide, and N,N'-methylene-bis(meth) acrylamide; and also 2,2-dimethylaminoethyl (meth) acrylate, 2,2-diethylaminoethyl (meth)acrylate, N,N-dimethylaminoethyl(meth)acrylamide, and N,N-dimethylaminopropyl(meth)acrylamide. In addition to these, also usable are styrene, vinyltoluene, divinylbenzene, N-vinylcarbazole, and N-vinylpyrrolidone.

Regarding the chemical structures of the component (A) and the component (B) that have been mentioned hereinabove, it is desirable that the components (A) and (B) are either linear or branched.

The amount of the component (C), an ethylenic unsaturated monomer in the composition is preferably from 10 to 50% by weight, more preferably from 15 to 40% by weight. If it is less than 10% by weight, the image reproducibility of the printing plate to be formed by the use of the composition is poor; but if it is more than 50% by weight, the repulsive elasticity of the printing plate tends to be lower.

As the component (D), any and every known photo-polymerization initiator capable of initiating the photo-polymerization of the component (C), ethylenic unsaturated monomer can be used. Above all, preferred are compounds having the function of producing radicals through absorption of light that results in autolysis or dehydrogenation. For example, the photo-polymerization initiator includes benzoin alkyl ethers, benzophenones, anthraquinones, benzils, acetophenones, and diacetyls. The amount of the photo-polymerization initiator in the compound is preferably from 0.1 to 10% by weight relative to the total weight of the composition.

In addition to the components (A) to (D), the composition of the present invention may contain a low-molecular compound having a cationic group. The compound is preferably a tertiary amine having a molecular weight of 500 or less, which includes, for example, alkylamines such as trimethylamine, triethylamine, and stearyldimethylamine, and also alcoholamines such as trimethanolamine, and triethanolamine. The amount of the low-molecular compound having a cationic group, if any, in the composition is preferably from 0.1 to 20% by weight, more preferably from 0.5 to 10% by weight, relative to the total weight of the composition.

In addition, the composition may further contain various polymers other than those of the components (A) to (D). For example, it is effective to incorporate into the composition a polyene compound which is liquid at room temperature, thereby augmenting the miscibility of the components constituting the composition. The polyene compound to be used for this purpose preferably has a number average molecular weight of from 500 to 50,000. Concretely, it includes, for example, polybutadiene and polyiroprene which are substantially non-crystalline (amorphous) and which are liquid at room temperature, and also modificates of such polyenes to be derived from them by utilizing the reactivity of their terminal groups and molecular chains. Examples of the modificates are intramolecular or terminal maleates, epoxidates, acryloylates and methacryloylates. It is desirable that the amount of the polyene compound of this type in the composition, if any, is from 1 to 15% by weight relative to the total weight of the composition. In order to improve the water-proofness and the repulsive flexibility of the printing plate to be formed by the use of the composition of the present invention, an elastomer which is solid at room temperature may be added to the composition. For example, usable are natural rubber and synthetic rubber. Concretely, examples of the elastomer capable of being added to the composition are nitrile rubber, butyl rubber, acrylic rubber, epichlorohydrin rubber, silicone rubber, urethane rubber, ethylene-propylene copolymer, urethane elastomer, ester elastomer, and chlorinated polyethylene. If such an elastomer which is solid at room temperature is added to the composition of the present invention, its amount is effectively from 1 to 50% by weight, more effectively from 10 to 40% by weight, relative to the total weight of the composition. It is also effective to add to the composition a solid polyolefin such as polymethylpentene.

In order to augment the stability of the photosensitive resin composition of the present invention during the preparation and storage thereof, a small amount of a polymerization inhibitor can be added to the composition. Examples of the polymerization inhibitor are phenols, hydroquinones, catechols and phenothiazines. It is desirable to add such a thermal stabilizer to the composition in an amount of from 0.001 to 5% by weight relative to the total weight of the composition.

As other additives, it is also possible to add, for example, dyes, pigments, ultraviolet absorbents and fragrances to the composition.

The above-mentioned components (A) and (B) and other polymers constituting the composition of the present invention may have crosslinked structures. For improving the profile of the relief of the printing plate to be formed by the use of the composition of the invention, however, the content of the crosslinked compounds to be in the composition is preferably 20% by weight or less, more preferably 10% by weight or less.

To prepare the photosensitive resin composition of the present invention, the above-mentioned components are dissolved in an organic solvent, such as toluene, xylene, acetone, methyl ethyl ketone, ethyl acetate or butyl acetate, and thereafter the solvent is removed from the resulting solution through vaporization.

In order to prepare a printing plate material, the photosensitive resin composition is applied onto a support to form a solid, photosensitive layer thereon. For example, a solution of the photosensitive resin composition of the invention is directly spread over a support and dried through vaporization to give a solid, photosensitive layer thereon. It is also possible to directly spread the solution over a cover film and dry it on the film through vaporization, and the thus-coated film may be attached to a support by facing the dried, photosensitive layer to the support. As still another method, a photosensitive layer prepared by removing the organic solvent from the solution comprising the photosensitive resin composition through vaporization is formed into a sheet, using a hot pressing machine, and the resulting sheet is laminated between a support and a cover film. It is also possible to extrude the solution through a single-screw extruder or double-screw extruder equipped with a T-die into a sheet.

It is desirable that the surface of the photosensitive layer of the printing plate material thus prepared in the manner as mentioned above, which is opposite to the surface thereof facing to the support, is covered with a thin layer consisting essentially of a water-soluble or water-dispersible resin, in order to improve the adhesiveness of the material to ordinary negative films.

As the support, for example, employable are metal plates of, for example, steel, stainless steel, aluminium or copper, plastic sheets such as polyester film, and synthetic rubber sheets, which may optionally have thereon an adhesive layer. On the support, formed is a photosensitive layer comprising the composition of the present invention, generally, at a thickness of from 0.1 to 10 mm.

To form a relief image for printing, using the photosensitive resin composition of the present invention, a negative or positive, original image film is kept in air-tight contact with the photosensitive layer as formed in the manner mentioned above, and the photosensitive layer is exposed to ultraviolet rays radiating from a high-pressure mercury lamp, an ultra-high-pressure mercury lamp, a metal halide lamp, a xenon lamp, a chemical lamp or a carbon arc lamp and generally having wavelengths falling between 300 nm and 450 nm, whereby it is cured through photo-reaction. Next, the non-cured area of the layer is dissolved or dispersed out into water, using a spraying-type or brushing-type developing machine, whereby an intended relief image is formed on the support. If desired, this is dried in air or in vacuum and then treated with active rays to produce a printing plate.

The printing plate of the present invention is suitably used as a flexographic printing plate having repulsive flexibility and having a Shore A hardness of from 30 to 70.

Next, the present invention is described in detail hereinunder with reference to the following examples, in which parts are by weight. The molecular weights as referred to in the examples were obtained through gel permeation chromatography (GPC).

SYNTHESIS EXAMPLES

<A-1> Compound Having Anionic Group:

76 g of polytetramethylene ether glycol (molecular weight: about 4000), 9.0 g of dimethylolpropionic acid and 15.0 g of tolylene diisocyanate were reacted to obtain a hydrophobic polyurethane having a number average molecular weight of 14,000 and a carboxyl group equivalent of 0.67 mole/kg.

<A-2> Compound Having Anionic Group:

103.2 g of polytetramethylene ether glycol (molecular weight: about 4000), 8.1 g of dimethylolpropionic acid and 15.0 g of tolylene diisocyanate were reacted to obtain a hydrophobic polyurethane having a number average molecular weight of 15,000 and a carboxyl group equivalent of 0.48 mole/kg.

<A-3> Compound Having Anionic Group:

84.0 g of polytetramethylene ether glycol (molecular weight: about 4000), 5.2 g of dimethylolpropionic acid and 15.0 g of diphenylmethane diisocyanate were reacted to obtain a hydrophobic polyurethane having a number average molecular weight of 20,000 and a carboxyl group equivalent of 0.37 mole/kg.

<B-1> Polymer Having Cationic Group:

68.3 g of lauryl methacrylate, 27.1 g of 2-hydroxyethylmethacrylic acid and 20.0 g of N,N-dimethylaminoethyl methacrylate were reacted to obtain a polymer having a number average molecular weight of 2900 and an amino group equivalent of 1.10 mole/kg.

<B-2> Polymer Having Cationic Group:

68.6 g of lauryl methacrylate, 20.0 g of 2-hydroxyethylmethacrylic acid and 30.0 g of N,N-dimethylaminoethyl methacrylate were reacted to obtain a polymer having a number average molecular weight of 2200 and an amino group equivalent of 1.61 mole/kg.

<B-3> Polymer Having Cationic Group:

64.5 g of lauryl methacrylate, 29.0 g of 2-hydroxyethylmethacrylic acid and 20.0 g of N,N-dimethylaminoethyl methacrylate were reacted to obtain a polymer having a number average molecular weight of 12,000 and an amino group equivalent of 1.12 mole/kg.

Example 1

32.2 parts of the polymer A-1, 12.9 parts of the polymer B-1 and 4.3 parts of N,N-dimethylaminopropylmethacrylamide (amino group equivalent: 5.88 mole/kg) were put into 25 parts of methyl ethyl ketone, fully stirred and dissolved. Next, 21.5 g of an urethane rubber, "UR-E" (produced by Takeda Chemical Industries, Ltd.) having neither an anionic group nor a cationic group, 21.5 parts of lauryl acrylate, 5.3 parts of an acrylic acid-modified butadiene rubber, "MAC-1000-80" (produced by Nippon Petro-Chemical Co.) having a carboxyl group equivalent of 1.15 mole/kg, and 2.2 parts of a photo-polymerization initiator, benzyl dimethyl ketal were added thereto, stirred and dissolved. The resulting solution was spread over a polyester substrate having a thickness of 100 $\mu$, which had been coated with a polyester adhesive and cured, in an amount capable of giving a photosensitive resin composition layer having a dry thickness of 1700 $\mu$, and dried in a perfect oven at 60° C. for 3 hours to form the photosensitive layer on the substrate. Thus was prepared a printing plate material. The amount of the anionic group in the composition was 0.28 mole/kg and that of the cationic group therein was 0.39 mole/kg.

The printing plate material was exposed to light for 5 seconds, in an exposing device having therein fifteen 20-W chemical lamps disposed in parallel in which the distance between the substrate and the lamps was 15 cm. Next, a negative film was hermetically attached to the photosensitive layer. Then, this was exposed to light for 10 minutes through the negative film in the same exposing device.

After having been thus exposed, this was developed in a brushing washer filled with neutral water (liquid temperature: 40° C.). After having been thus developed for 13 minutes, a relief image having a depth of 800 µ, which was faithful to the negative film, was formed. Thus was produced a printing plate. The relief formed was not rough and had a good surface profile.

Using aqueous ink, the printing plate was subjected to a flexographic printing test where 100,000 prints were produced. After the test, the surface of the printing plate did not change at all, and the prints produced were all good.

Example 2

A photosensitive resin composition was prepared in the same manner as in Example 1, except that the polymer A-2 was used in place of the polymer A-1. The anionic group content of the composition was 0.22 mole/kg, and the cationic group content thereof was 0.39 mole/kg.

After having been exposed and then developed for 18 minutes in the same manner as in Example 1, obtained was a printing plate having thereon a relief image having a depth of 700 µm. The relief formed was not rough and had a good surface profile.

Using aqueous ink, the printing plate was subjected to a flexographic printing test where 100,000 prints were produced. After the test, the surface of the printing plate did not change at all, and the prints produced were all good.

Example 3

In the same manner as in Example 1 except that A-3 was used in place of A-1, a photosensitive resin composition and then a printing plate material were obtained. The anionic group content of the composition was 0.18 mole/kg, and the cationic group content thereof was 0.39 mole/kg.

After having been exposed and then developed for 45 minutes in the same manner as in Example 1, obtained was a printing plate having thereon a relief image having a depth of 700 µm. The relief formed was not rough and had a good surface profile.

Using aqueous ink, the printing plate was subjected to a flexographic printing test where 100,000 prints were produced. After the test, the surface of the printing plate did not change at all, and the prints produced were all good.

Example 4

In the same manner as in Example 1 except that B-2 was used in place of B-1, a photosensitive resin composition and then a printing plate material were obtained. The anionic group content of the composition was 0.28 mole/kg, and the cationic group content thereof was 0.46 mole/kg.

After having been exposed and then developed for 12 minutes in the same manner as in Example 1, obtained was a printing plate having thereon a relief image having a depth of 800 µm. The relief formed was not rough and had a good surface profile.

Using aqueous ink, the printing plate was subjected to a flexographic printing test where 100,000 prints were produced. After the test, the surface of the printing plate did not change at all, and the prints produced were all good.

Example 5

In the same manner as in Example 1 except that B-3 was used in place of B-1 and that the acrylic-modified butadiene rubber "MAC-1000-80" was not used, a photosensitive resin composition and then a printing plate material were obtained. The anionic group content of the composition was 0.23 mole/kg, and the cationic group content thereof was 0.42 mole/kg.

After having been exposed and then developed for 12 minutes in the same manner as in Example 1, obtained was a printing plate having thereon a relief image having a depth of 700 µm. The relief formed was faithful to the negative film used and was not rough, and this had a good surface profile.

Using aqueous ink, the printing plate was subjected to a flexographic printing test where 100,000 prints were produced. After the test, the surface of the printing plate did not change at all, and the prints produced were all good.

Example 6

In the same manner as in Example 1 except that 4.3 parts, but not 12.9 parts, of B-1 was used, a photosensitive resin composition and then a printing plate material were obtained. The anionic group content of the composition was 0.30 mole/kg, and the cationic group content thereof was 0.33 mole/kg.

After having been exposed and then developed for 10 minutes in the same manner as in Example 1, obtained was a printing plate having thereon a relief image having a depth of 700 µm. The relief formed was faithful to the negative film used and was not rough, and this had a good surface profile.

Using aqueous ink, the printing plate was subjected to a flexographic printing test where 100,000 prints were produced. After the test, the surface of the printing plate did not change at all, but the line image in the 2000th print was somewhat thicker than that in the 100,000th print. However, the printing plate produced herein was satisfactory in practical use.

Comparative Example 1

In the same manner as in Example 1 except that the polymer B-1 was not used and that 8.6 parts, but not 4.3 parts, of N,N-dimethylaminopropylmethacrylamide was used, a photosensitive resin composition and then a printing plate material were obtained. The anionic group content of the composition was 0.30 mole/kg, and the cationic group content thereof was 0.55 mole/kg.

After having been exposed and then developed for 7 minutes in the same manner as in Example 1, obtained was a printing plate having thereon a relief image having a depth of 800 µm. The relief formed was faithful to the negative film used and was not rough, and this had a good surface profile.

Using aqueous ink, the printing plate was subjected to a flexographic printing test where 100,000 prints were produced. After the test, the relief on the printing plate was partly broken. Since the composition used herein to form the printing plate did not contain B-1, which is a polymer having a cationic group and having a number average molecular weight of 1000 or more, the relief on the printing plate was swollen with the aqueous ink as applied thereto in the printing test, and it was partly broken.

Example 7

In the same manner as in Example 1 except that 45.2 parts, but not 12.9 parts, of B-1 was used, that the acrylic-modified butadiene rubber "MAC-1000-80" was not used and that 4.3 parts of N,N-dimethylaminopropylacrylamide (amino group equivalent: 6.41 mole/kg) was used in place of N,N-dimethylaminopropylmethacrylamide, a photosensitive resin composition and then a printing plate material were obtained. The anionic group content of the composition was 0.13 mole/kg, and the cationic group content thereof was 0.61 mole/kg.

After having been exposed and then developed for 14 minutes in the same manner as in Example 1, obtained was a printing plate having thereon a relief image having a depth of 800 μm. The relief formed was faithful to the negative film used and was not rough, and this had a good surface profile.

Using aqueous ink, the printing plate was subjected to a flexographic printing test where 100,000 prints were produced. After the test, the surface of the printing plate did not change at all, and the prints produced were all good.

Comparative Example 2

In the same manner as in Example 1 except that the acrylic-modified butadiene rubber "MAC-1000-80" was not used and that 1.0 part of N,N-dimethylaminopropylacrylamide (amino group equivalent: 6.41 mole/kg) was used in place of 4.3 parts of N,N-dimethylaminopropylmethacrylamide, a photosensitive resin composition and then a printing plate material were obtained. The anionic group content of the composition was 0.27 mole/kg, and the cationic group content thereof was 0.13 mole/kg.

After having been exposed and then developed for 45 minutes in the same manner as in Example 1, formed was a relief image having a depth of only 100 μm. This is because the cationic group content of the photosensitive composition prepared herein was too small and the development of the composition water was almost impossible.

Example 8

24.9 parts of the polymer A-1, 10.4 parts of the polymer B-1 and 3.3 parts of N,N-dimethylaminopropylmethacrylamide were dissolved in 15 parts of a solution of methyl ethyl ketone and fully stirred. This was dried in a perfect oven at 40° C. for 5 hours. To this were added 33.3 parts of SIS 5000 (styrene-isoprene-styrene rubber, produced by Nippon Synthetic Rubber Co.), 26.0 parts of lauryl acrylate, and 2.1 parts of a photopolymerization initiator, benzyl dimethyl ketal, and kneaded in a two-roll kneader as heated at 60° C. Using a pressing machine as heated at 80° C., the photosensitive resin composition thus obtained was sandwiched under pressure between a 100 μ-thick polyester substrate, which had been coated with a polyester adhesive and cured, and a polyester cover film as coated with polyvinyl alcohol to give a photosensitive layer therebetween having a thickness of 1.7 mm. Thus was obtained a printing plate material. The anionic group content of the composition was 0.16 mole/kg and the cationic group content of the composition was 0.31 mole/kg.

The cover film was peeled from the printing plate material, and a negative film was hermetically attached to the photosensitive layer of the printing plate material. This was exposed to light for 3 minutes, using a 2-KW ultra-high-pressure mercury lamp, at a distance of 1 m from the lamp.

After having been thus exposed, this was developed in a brushing washer filled with neutral water (liquid temperature: 40° C.). After having been thus developed for 15 minutes, a relief image having a depth of 800 μ, which was faithful to the negative film, was formed. Thus was produced a printing plate Using aqueous ink, the printing plate was subjected to a flexographic printing test where 100,000 prints were produced. After the test, the surface of the printing plate did not change at all, and the prints produced were all good.

Comparative Example 3

In the same manner as in Example 8 except that 66.6 parts, but not 33.3 parts, of SIS 5000 was used, a photosensitive resin composition and then a printing plate material were obtained. The anionic group content of the composition was 0.127 mole/kg, and the cationic group content thereof was 0.17 mole/kg.

After having been exposed and then developed for 45 minutes in the same manner as in Example 8, formed was a relief image having a depth of only 100 μm. This is considered because the anionic group content of the photosensitive composition prepared herein was too small and the developability of the composition was retarded.

For reference, the characteristics of the printing plates obtained in the above-mentioned examples and examples are shown below.

TABLE 1

|  | | Degree of Swelling with Water (%) | Shore A Hardness (°) | Degree of Repulsive Elasticity (%) |
|---|---|---|---|---|
| Example | 1 | 2.5 | 65 | 39 |
|  | 2 | 1.5 | 62 | 35 |
|  | 3 | 1.5 | 59 | 35 |
|  | 4 | 2.5 | 66 | 37 |
|  | 5 | 2.5 | 60 | 35 |
|  | 6 | 8.0 | 65 | 33 |
|  | 7 | 3.5 | 66 | 35 |
|  | 8 | 1.5 | 59 | 37 |
| Comparative Example | 1 | 19.0 | 69 | 30 |
|  | 2 | 4.0 | 60 | 37 |
|  | 3 | 1.0 | 53 | 39 |

Degree of Swelling with Water: After the printing plate was dipped in water for 24 hours, the increase in the weight of the thus-dipped printing plate was measured in percentage. The lower value indicates that the printing plate has higher resistance to aqueous ink.

Shore A Hardness: The hardness of the printing plate was measured at 25° C.

Degree of Repulsive Elasticity: An iron ball having a weight of 5.2 g was dropped down onto the printing plate, and the ratio of the height of the ball as rebounded to the height of the ball being dropped down was obtained in percentage. The higher value indicates that the printing plate has higher printing durability in flexography under high load.

As having the constitution mentioned hereinabove, the present invention has realized the provision of a photosensitive resin composition capable of being developed with water to give a flexographic printing plate. The printing plate exhibits excellent printing durability in flexography using aqueous ink.

We claim:

1. A photosensitive resin composition that is developable with water and capable of cross-linking selectively when exposed to light, comprising:

(A) a hydrophobic polymer having an anionic group content of 0.2 to 2.0 mole/kg based on said hydrophobic polymer, (B) a polymer having a cationic group content of 0.2 to 3.5 mole/kg based on the cationic polyer and a number average molecular weight of 1000 or more, (C) an ethylenic unsaturated monomer, and (D) a photo-polymerization initiator, wherein the anionic group content in the resin composition is 0.15 mole/kg or more based on said resin composition, the cationic group content in the resin composition is 0.15 mole/kg or more based on said resin composition and the component (A), when formed into a film having a thickness of 1 mm and dipped in water at room temperature for 24 hours, has a degree of swelling of 5% by weight or less.

2. The photosensitive resin composition as claimed in claim 1, which contains a polyurethane as component (A).

3. The photosensitive resin composition as claimed in claim 1, wherein the component (B) is a compound having an alcoholic hydroxyl group.

4. The photosensitive resin composition as claimed in claim 1, wherein component (A) and component (B) are substantially linear or branched.

5. The photosensitive resin composition as claimed in claim 1, wherein the ratio of the number of anionic groups to that of cationic groups is from 0.2 to 1.7.

6. The photosensitive resin composition as claimed in claim 1, wherein the anionic group is at least one selected from the group consisting of a carboxyl group, a phenolic hydroxyl group and a sulfonic acid group.

7. The photosensitive resin composition as claimed in claim 1, wherein the anionic group is at least one selected from the group consisting of a carboxyl group, a phenolic hydroxyl group, a phosphoric acid group and a sulfonic acid group.

8. The photosensitive resin composition as claimed in claim 1, wherein the cationic group is an amino group.

9. A printing plate material having, on a support, a photosensitive layer that comprises a photosensitive resin composition as claimed in any one of claims 1, 2 and 3–8.

10. The printing plate material as claimed in claim 9, wherein the photosensitive layer is solid.

11. A flexographic printing plate formed photosensitive resin composition as claimed in claim 1.

12. A photosensitive resin composition comprising:

(A) 10–70 wt % of a hydrophobic polymer having an anionic group content of 0.2 to 2.0 mole/kg based on said hydrophobic polyer, (B) 1–60 wt % of a polymer having a cationic group content of 0.2 to 3.5 mole/kg based on the cationic polyer and a number average molecular weight of 1000 or more, (C) 10–50 wt % of an ethylenic unsaturated monomer, and (D) 0.1–10 wt % of a photo-polymerization initiator, wherein the anionic group content in the resin composition is 0.15 mole/kg or more based on said resin composition, the cationic group content in the resin composition is 0.15 mole/ks or more based on said resin composition and the component (A), when formed into a film having a thickness of 1 mm and dipped in water at room temperature for 24 hours, has a degree of swelling of 5% by weight or less.

* * * * *

UNITED STATES PATENT AND TRADEMARK OFFICE
CERTIFICATE OF CORRECTION

PATENT NO. : 5,916,731
DATED : June 29, 1999
INVENTOR(S) : Tanaka et al.

It is certified that error appears in the above-identified patent and that said Letters Patent is hereby corrected as shown below:

In Column 4, at line 21, please change "the same carboxyl group in one" to --one carboxyl group in the same--.

In Column 16, at line 8, after "formed", please insert --by imagewise exposure to ultraviolet rays and development with water of the--; and at line 25, please change "ks" to --kg--.

Signed and Sealed this

Twentieth Day of June, 2000

Attest:

Q. TODD DICKINSON

*Attesting Officer*            *Director of Patents and Trademarks*